United States Patent [19]
Betts

[11] Patent Number: 5,103,227
[45] Date of Patent: Apr. 7, 1992

[54] MODULUS CONVERTER FOR FRACTIONAL RATE ENCODING

[75] Inventor: William L. Betts, St. Petersburg, Fla.

[73] Assignee: AT&T, New York, N.Y.

[21] Appl. No.: 588,658

[22] Filed: Sep. 26, 1990

[51] Int. Cl.⁵ .............................................. G06F 5/00
[52] U.S. Cl. ....................................... 341/61; 341/141
[58] Field of Search ................... 341/61, 141; 370/83, 370/99; 375/39, 38

[56] References Cited

U.S. PATENT DOCUMENTS

| | | | |
|---|---|---|---|
| 4,281,318 | 7/1981 | Candy et al. | 341/61 |
| 4,755,794 | 7/1988 | Candy | 341/61 |
| 4,941,154 | 7/1990 | Wei | 375/39 |

Primary Examiner—A. D. Pellinen
Assistant Examiner—Sharon D. Logan
Attorney, Agent, or Firm—Kane, Dalsimer, Sullivan, Kurucz, Levy, Eisele & Richard

[57] ABSTRACT

Fractional rate modulation conversion is accomplished by separating incoming data into frames of bits. Each frame is partitioned into bit words of unequal bit lengths. The words are divided by a modulus to obtain remainders. The remainders are then multiplexed into sequential bauds of common modulus. The apparatus can be used for data compression as well as efficient modulation in bandwidth restricted channels.

6 Claims, 4 Drawing Sheets

FRACTIONAL BIT CODING
BITS/BAUD AND MODULUS (NUMBER OF SIGNAL POINTS)

| DATA RATE | BAUD RATE | | | | | | | | | | | | |
|---|---|---|---|---|---|---|---|---|---|---|---|---|---|
| | 2400 | | 2743 | | 2800 | | 2880 | | 3086 | | 3200 | |
| 24000 | 10 | 1024 | $\frac{35}{4}$ | 451 | $\frac{60}{7}$ | 381 | $\frac{25}{3}$ | 323 | $\frac{70}{9}$ | 220 | $\frac{15}{2}$ | 182 |
| 21600 | 9 | 512 | $\frac{63}{8}$ | 235 | $\frac{54}{7}$ | 211 | $\frac{15}{2}$ | 182 | 7 | 128 | $\frac{27}{4}$ | 108 |
| 19200 | 8 | 256 | 7 | 128 | $\frac{48}{7}$ | 116 | $\frac{20}{3}$ | 102 | $\frac{56}{9}$ | 75 | 6 | 64 |
| 16800 | 7 | 128 | $\frac{49}{8}$ | 70 | 6 | 64 | $\frac{35}{6}$ | 58 | $\frac{49}{9}$ | 44 | $\frac{21}{4}$ | 39 |
| 14400 | 6 | 64 | $\frac{21}{4}$ | 39 | $\frac{36}{7}$ | 36 | 5 | 32 | $\frac{14}{3}$ | 26 | $\frac{9}{2}$ | 23 |
| 12000 | 5 | 32 | $\frac{35}{8}$ | 21 | $\frac{30}{7}$ | 20 | $\frac{25}{6}$ | 18 | $\frac{35}{9}$ | 15 | $\frac{15}{4}$ | 14 |
| 9600 | 4 | 16 | $\frac{7}{2}$ | 12 | $\frac{24}{7}$ | 11 | $\frac{10}{3}$ | 11 | $\frac{28}{9}$ | 9 | 3 | 8 |
| 7200 | 3 | 8 | $\frac{21}{8}$ | 7 | $\frac{18}{7}$ | 6 | $\frac{5}{2}$ | 6 | $\frac{7}{3}$ | 6 | $\frac{9}{4}$ | 5 |

FRACTIONAL FRAMES

| DATA RATE | 2400 | 2743-8 | 2800-7 | 2880-6 | 3086-9 | 3200-4 |
|---|---|---|---|---|---|---|
| 24000 | 10 | 9 9 9 8 9 9 9 9 | 9 8 9 8 9 8 9 | 9 8 8 9 8 8 | 8 8 8 6 7 8 8 8 7 | 8 7 8 7 |
| 21600 | 9 | 8 8 8 8 8 8 7 | 8 8 7 8 8 7 8 8 7 | 8 7 8 7 8 7 | 7 7 7 7 7 7 7 7 | 7 7 7 6 |
| 19200 | 8 | 7 7 7 7 7 7 7 7 | 7 7 7 7 7 7 7 | 7 7 6 7 7 6 | 7 6 6 6 7 6 6 6 | 6 6 6 6 |
| 16800 | 7 | 7 6 6 6 6 6 6 6 6 | 6 6 6 6 6 6 6 | 6 6 6 6 6 5 | 6 5 6 5 6 5 | 6 5 5 5 |
| 14400 | 6 | 6 5 5 5 6 5 5 5 | 6 5 5 5 5 5 5 5 | 5 5 5 5 5 | 5 5 4 5 5 4 5 5 4 | 5 4 5 4 |
| 12000 | 5 | 5 4 4 5 4 4 5 | 5 4 4 4 5 4 4 4 | 5 4 4 4 4 | 4 4 4 4 4 4 4 4 4 | 4 4 4 3 |
| 9600 | 4 | 4 3 4 3 4 3 | 4 3 4 3 4 3 | 4 3 4 3 4 3 | 4 3 3 3 3 3 3 3 | 3 3 3 3 |
| 7200 | 3 | 3 3 2 3 2 3 2 3 | 3 2 3 2 3 2 3 | 3 2 3 2 3 2 | 3 2 2 3 2 2 2 2 | 3 2 2 2 |

MODULUS CONVERTER FOR FRACTIONAL RATE ENCODING

RELATED APPLICATION

This application is related to application Ser. No. 588,656 filed herewith and entitled Fractional Rate Modulation.

BACKGROUND OF THE INVENTION

A. Field of the Invention

This invention pertains to a converter for generating a bit stream representative of a fractional rate encoding which may be incorporated for example into a QAM modem, as well as to a method for the same.

B. Description of the Prior Art

Quadrature amplitude modulation (QAM) has become the standard method of data transmission over long distances because it provides a means of transmitting data at a much higher data rate than the baud rate of a particular channel. However, until now in all the QAM methods used by various QAM modems, because of the inherent limitations of the encoding schemes, the ratio of the data rate and the baud rate of the channel had to be an integer and the number of points in the signal constellation had to be a power of 2, (i.e. 2, $2^2=4$, $2^3=8$ etc.) Improvements in signal transmission methods and circuitry have resulted in significant improvements in the bandwidth of certain channels, but because of the above mentioned constraints, the baud rate of a channel was still limited to values below the actual channel bandwidth.

Schemes for overcoming these problems, involving fractional rate encoding had been tried, but these schemes were limited to a channel having a particular bandwidth and could not be adapted to other channels because of circuit complexity.

OBJECTIVES AND SUMMARY OF THE INVENTION

In view of the above mentioned disadvantages of the prior art, an objective of the present invention is to provide a modulus converter which can handle any data rate and generate a corresponding bit stream suitable.

A further objective is to provide an efficient and effective fractional rate encoder by modulus conversion of an incoming data stream into an output stream having frames of a particular structure.

Other advantages and objectives of the converter shall become apparent from the following description of the invention. A modulus converter constructed in accordance with this invention includes a plurality of remainder circuit means coupled in series to generate remainders by dividing the bits within a variable length word by a modulus. The number of circuit means equals the number of bauds per frame for a preselected baud and data bit rate pair. The remainders are then transmitted over a channel operated at an expanded bandwidth. At the receiver end the process is reversed to reconstruct the original data.

BRIEF DESCRIPTION OF THE FIGURES

FIG. 1 shows a table indicating the fractional data rate and the corresponding number of signal points for various input data rates and baud rates;

FIG. 2 shows how an incoming data bit stream is partitioned into frames of various lengths for various baud rates;

DETAILED DESCRIPTION OF THE INVENTION

Figure 3:
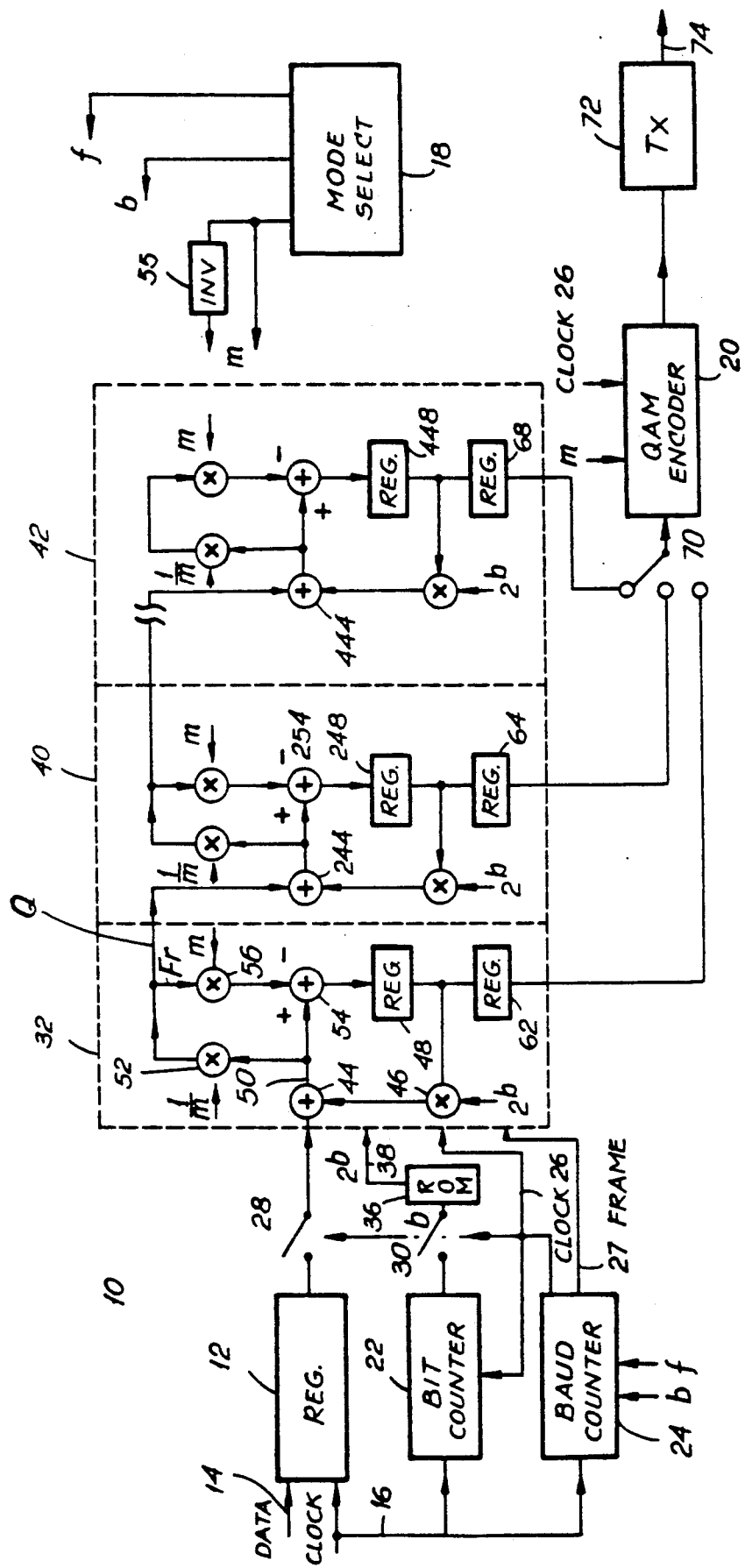
FIG. 3 shows a block diagram for a fractional rate encoder constructed in accordance with this invention.

The modulus converter constructed in accordance with this invention is described in conjunction with a data transmission system, it being understood that the converter may be used for other purposes as well.

A very common baud rate for modems is 2400 baud/sec. As shown in FIG. 1, at this baud rate, for a data rate of 7200 bits/sec, each baud corresponds to 3 bits, for a data rate of 9600 bits/sec, each baud corresponds to 4 bits, and so on. Furthermore, in a QAM modulation scheme, 8 signal points are required for 7200 bits/sec, 16 signal points are required for 9600 bits/sec and so on. In general, the number of points required for a given data and baud rate is given by $m=2^c$, where $c=$(bit rate/baud rate) and is generally an integer.

However, as discussed above, many channels can now be used for broader bandwidth data transmission. For example, standard leased telephone cable can be used to transmit 3200 baud/sec reliably. Submarine cables can be used to transit 2800 baud/sec. Therefore, fractional rate encoding techniques are needed to transmit data efficiently at these higher baud rates. In fractional rate encoding the number of signal points m is the nearest integer larger than $2^c$ where c is a fraction which approximates the ratio of bit rate/baud rate. As shall become apparent from the discussion below, the divisor of c is preferably small. FIG. 1 shows some ratios selected for various bit and baud rates, and the corresponding number of signal points m required for QAM data transmission.

The improvement in the performance of fractional encoding over standard encoding is significant, and it may be expressed as $i=10 \log (m_1 b_1 / m_2 b_2)$ where i is an indicia for performance, $m_1$ is the number of constellation points using standard QAM techniques at baud rate, $b_1$, and $m_2$ is the number of constellation points for fractional QAM encoding at baud rate, $b_2$. For example from the table in FIG. 1, for 24000 bits/sec at $b_1=2400$ baud, the number of signal points $m_1=1024$. If the baud rate is increased to $b_2=2743$, the number of signal points required for the same bit rate is reduced to $m_2=431$. The improvement in the performance is then about 3.18 db.

Inspection of the table in FIG. 1 indicates that for a given baud rate, the divisor for c for each bit rate is either the same (for example 7 for 2800 baud) or have a common multiple. For example, for 3086 bauds the division is either 3 or 9. For 3200 bauds, the division is either 2 or 4. This divisor shows the number of bauds required to send the number of bits indicated by the dividend. For example for a 3200 baud, 24000 bits/s transmission ratio $c=15/2$ indicating that 2 bauds are required to send 15 bits, using a QAM scheme of 182 signal points.

In the present invention, the fractional rate encoding is accomplished as follows. First the incoming data binary data bits are partitioned into words, with a preselected number of words forming a frame. More particularly the number of bits per frame is equal to the numerator of the ratio c as defined above. The number of words per frame is equal to the divisor of ratio c. Each word is made up of an integer number of bits and the number of bits per word may be different. Output data will be grouped into bauds which may contain a fractional number of bits identified by $\log_2 m$ where m is the modulus. All bauds will have the same modulus for efficient transmission. Input data is in binary words. Output data is in fractional bauds. Advantageously, for a given baud rate, while the number of bits per word may change, the same number of words is grouped to form frames having the same number of bits. FIG. 2 shows how bits may be arranged into words and the words may be grouped into frames. For example, for 3200 baud the number of words per frame is selected to equal the least common multiplier for the divisors, i.e. four. Then for 24000 bits/sec at 3200 baud, each sequential 30 binary bits are partitioned into four words, the first and third words containing 8 bits and second and fourth words containing 7 bits. Similarly, as shown in FIGS. 1 and 2. for a 3200 baud, 7200 bit/sec. transmission. $c = 9/4$. Therefore a frame is used to transmit four words. The first word contains or corresponds to three bits, and the remaining words contain 2 bits each. Each word within a frame undergoes a modulus conversion with the number of points m being used as a modulus, as detailed below. The converted bauds are then fed to a QAM encoder.

Details of a circuit used for modulus conversion are shown in FIG. 3. The circuit 10 includes a serial in-parallel, out shift register 12 for receiving data bits on line 14, under the control of clock pulses on line 16. A mode selector 18 is used to set up the circuit to convert the data bits in accordance to the bit rate received on line 14 and the baud rate of the particular channel used. Based on these parameters, the mode selector generated three control parameters for the modula, i.e. m, the number of signal points required by a QAM encoder 20 to transmit the data signals; b, the number of bits per each word; and f, the number of words per frame, as defined in FIGS. 1 and 2. The parameters, m and f, are constant for a given pair of baud and bit rates. The parameter b changes as shown in FIG. 2. For example, for a 24000 bit/sec, 3200 baud transmission, $m = 182$, $f = 4$ and $b = 7$ or 8.

The clock pulses on line 16 are used by a bit counter 22 and a baud counter 24. For the example given above (i.e. 24000 bit/sec 3200 baud) initially, $b = 8$ (see FIG. 2).

While the data bits are entered serially into register 12, counter 22 counts the bits contained therein. Baud counter 24 keeps track of the number of bits received and when this number equals b, the baud counter generates an enabling signal on line 26. Register 12 has an output port illustrated in FIG. 3 symbolically as a switch 28. Similarly, counter 22 has an output port symbolized by a switch 30. In response to the enabling signal on line 26, switch 28 transfers in parallel the b bits found in register 12 to a remainder cell 32. Similarly, in response to the enabling pulse on line 26, switch 30 also transmits count b from counter 22 to a look-up table such as a ROM 36. In response ROM 36 generates a binary signal equal to $2^b$ on line 38. This $2^b$ is the modulus or base of the input data word in register 12. Finally, the signal on line 26 is also used as a clock signal to clock the various elements of the remainder cell 32, as well as, the other remainder cells described more fully below.

Remainder cell 32, as well as the other remainder cells such as cells 40 and 42 are used to calculate the remainder in modulus m for the f bauds in a frame. More particularly, each remainder cell calculates the remainder for one of the bauds, with the higher remainder cells also taking into account the integer portion of the quotient generated by the previous cells. Thus, the number of remainder cells required for a conversion is equal to f. In FIG. 3, the first cell 32, second cell 40, and last or most significant digit cell 42 are shown. Since all the cell are identical, the cell between cells 40 and 42 (and more intermediate cells for converters with more bauds per frame) are not shown for the sake of simplicity.

For a first word $X_0$, in remainder cell 32, the bits from register 12 for a first word $X_0$ are first entered into an adder 44. Adder 44 receives a second input from a multiplier 46. Multiplier 46 multiplies the outputs of register 48 and ROM 36. Since at the end of each frame, the clear signal on line 27 clears register 48, for the first byte in register 12, the output of multiplier 46 is 0. The output of adder 44 is entered on line 50 to a multiplier 52 and an adder 54. An invertor 55 is used to invert the parameter m from mode selector 18 thereby generating a parameter 1/m described in more detail below. Multiplier 52 in effect divides the output of adder 44 by m and generates a quotient which has two components: an integer component Q and a fractional component Fr. Instead of this scheme, a true division may also be performed. However, multiplication by the inverse because it is easier and cheaper to implement is preferable. Fractional component Fr is truncated to zero. The integer component Q is multiplied in multiplier 56 by m to scale it back to the magnitude before the operation of multiplier 52. The output of multiplier 56 is fed to adder 54 which subtracts it from the output of adder 44 on line 50. The output of adder 54 is the remainder of first word $X_0$ from register 12 when divided by m. This remainder is stored in register 48 as a remainder R0. The remainder is always less than m. The quotient Q passes through adders 244 and 254 of remainder cell 40 and is stored in register 248 as a remainder R1.

If a multiplication by the inverse 1/m rather than a true division is performed, a quantizing error is introduced into the process. A check may be performed at the end of each iteration to insure that as a result of this quantizing error, the output of adder 54 is not too large. For example, the output of adder 54 may be compared to m. An output bigger than m is unacceptable. This error may be corrected by subtracting m from the output of adder 54 (several times if necessary until the adder 54 is reduced below m. For each correction the integer component Q on line Q must be increased by one.

For the next word $X_1$, a similar iteration occurs two exceptions: since new byte $X_1$ has only 7 bits, b now is changed to 7 in accordance with the arrangement of bits shown in FIG. 2, and adder 44 adds $R_0 * 2^b$ to $X_1$. The rest of the remainder cells operate on this new sum as described above. The multiplier is important because it allows successive words of various bits in size to be successively converted. Conventional modulus or base conversion would require all bits in a frame to be held in a single large register with increased complexity. After four iterations, during which each of the cells is progressively brought into play, the registers in the remainder cells contain the remainders required to uniquely define f bauds from register 12 in modula m. The intermediate results of the iterations and the final contents of the registers 48, 248, 448 are shown in table I below:

TABLE I

| BAUD | INPUT | $R_0$ | $R_1$ | $R_2$ | $R_3$ |
|------|-------|-------|-------|-------|-------|
| 0 | $X_0$ | $R_0 = \text{rem } X_0$ | $R_1 = \text{mod } X_0$ | | |
| 1 | $X_1$ | $R'_0 = 2^b R_0 + X_1$ | $R'_1 = 2^b R_1 + \text{mod } R'_0$ | $R_2 = \text{mod } R'_1$ | |
|   |       | $R_0 = \text{rem } R'_0$ | $R_1 = \text{rem } R'_1$ | | |
| 2 | $X_2$ | $R'_0 = 2^b R_0 + X_2$ | $R'_1 = 2^b R_1 + \text{mod } R'_0$ | $R'_2 = 2^b R_2 + \text{mod } R'_1$ | $R_3 = \text{mod } R'_2$ |
|   |       | $R_0 = \text{rem } R'_0$ | $R_1 = \text{rem } R'_1$ | $R_2 = \text{rem } R'_2$ | |
| 3 | $X_3$ | $R'_0 = 2^b R_0 + X_3$ | $R'_1 = 2^b R_1 + \text{mod } R'_0$ | $R'_2 = 2^b R_2 + \text{mod } R'_1$ | $R'_3 = 2^b R_3 + \text{mod } R'_2$ |
|   |       | $R_0 = \text{rem } R'_0$ | $R_1 = \text{rem } R'_1$ | $R_2 = \text{rem } R'_2$ | $R_3 = \text{rem } R'_3$ |

In this table the $R'_i$ indicates the output of the initial adder of the i-th cell. Thus when second word $X_1$ is read into the first remainder cell 32, intermediate parameter $R'_0$ is given by $$R'_0 = 2^b R_0 + X_1.$$

After the remainders for all the bytes of a frame have been generated, baud counter 24 generates a pulse on line 27 which as previously mentioned, clears the registers 48, 248, 448 of each remainder cells. However, the information from these registers is transferred before clearing to respective storage registers 62, 64, 68.

In the next four baud periods (for f=4) the remainder cells convert the next four bauds as described above. Meanwhile multiplexer switch 70 samples each of the storage registers 62, 64, . . . 68, starting with the most significant baud found in storage register 68. The remainders stored therein are then sequentially transferred by switch 70 to QAM encoder 20. The QAM encoder also receives the modulus m from mode selector 18. The switch 70 may be stepped from one storage register to another by the clock pulses on line 26. The same clock pulses may also be used by the encoder 20 to generate the proper QAM signals. The QAM encoder generates a QAM signal constellation of m points. All remainders are limited to values between 0 and m−1. As a result the last remainder cell 42 has an zero integer component Q, and overflow or non-zero Q is prevented. The modulus m is chosen to be the smallest integer greater than $2^c$ where c=bit rate/baud rate. Since m/24 $2^{(b0+b1+b2+b3)}$ thus, the modulus is chosen such that overflow can not occur. The bit rate is achieved with the smallest possible signal constellation or modulus.

The output of encoder 20 is fed to transmitter circuitry 72 which generates corresponding analog signals for transmission over a channel 74.

Figure 4:
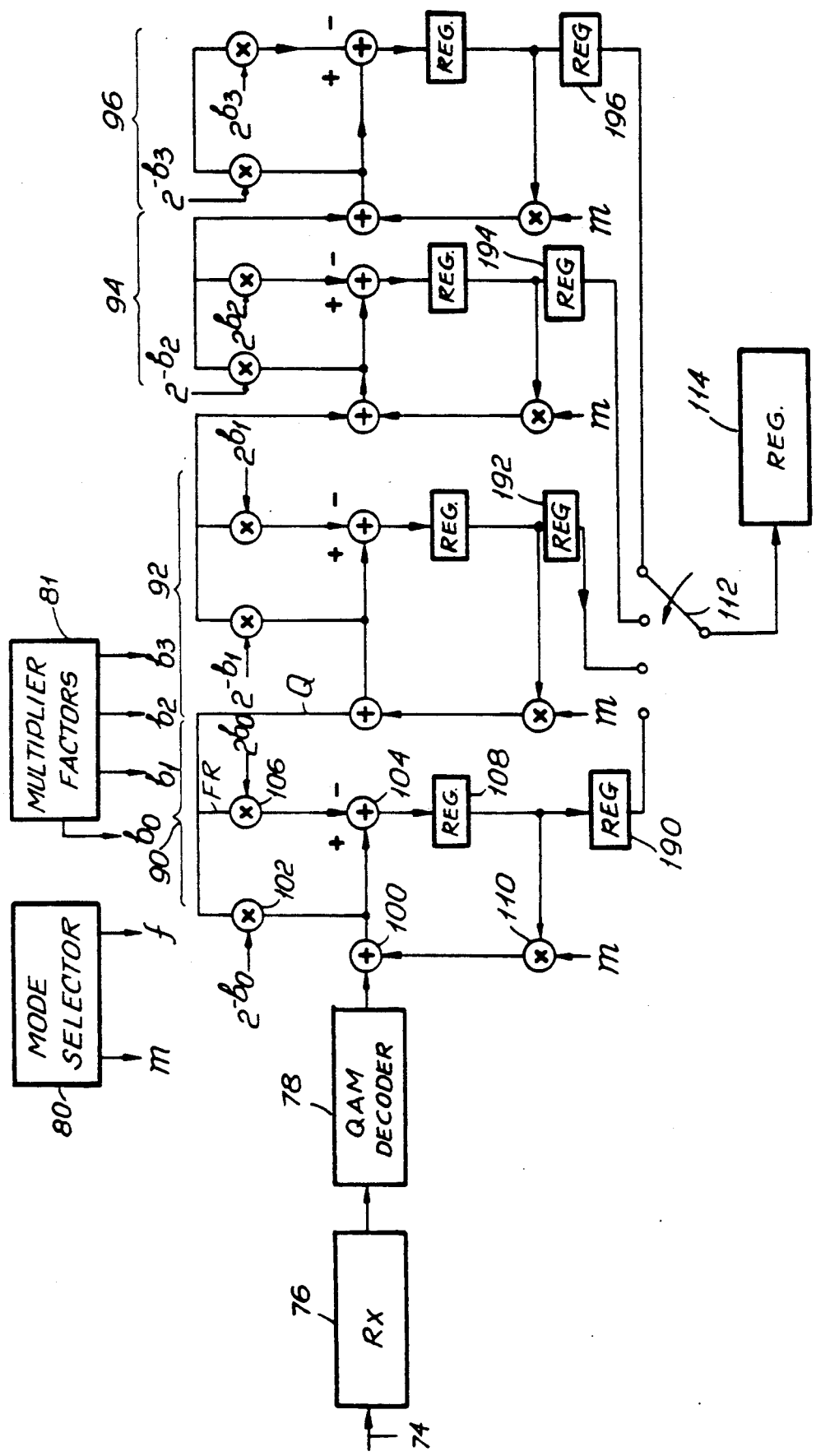
FIG. 4 shows a block diagram for a decoder matching the encoder of FIG. 3.

At the receiver end, as shown in FIG. 4, analog signals from channel 74 are converted into digital signals by receiver circuitry 76. These digital signals are fed to QAM decoder 78. At the receiver end there is also mode selector 80 which is used to generate the parameters m and f in a manner identical to mode selector 18. Multipliers $b_0$, $b_1$, $b_2$, $b_3$ and their inverses are stored in a register 81. Alternatively, the inverses of these parameters are calculated as described more fully above. Again, the number of remainder circuits is equal to the number of words per frame f. The remainder circuits are used to convert the fractionally encoded signals into standard binary signals. In remainder circuit 90, the bits corresponding to the first received baud from a given frame are fed to an adder 100. The output of adder 100 is fed to a multiplier 102 and another adder 104. Multiplier 102 divides its input by $2^{b0}$ to generate a truncated integer Q described above. The integer Q is fed into a second multiplier 106 which multiplies by $2^{b0}$. The output is subtracted from the output of adder 100 by adder 104 to generate a first remainder. This first remainder is stored in register 108. The quotient Q is processed by the next remainder circuit 92.

In the next baud period, multiplier 110 multiplies the output remainder in register 108 by m and the product is added to the bits corresponding to the next baud from QAM decoder 78 by adder 100. The whole process is then repeated. At the end of the frame, the buffer registers of the remainder circuits 90, 92, 94 96 contain the remainders which are saved in buffer register 190 192, 194, 196 and multiplexed by a switch 112, starting with the output of the last remainder circuit 96. The binary signals from switch 112 are then fed to a register 114 for further processing.

Operation of the receiver remainder circuits is identical to the transmitter except the multiplier coefficients are changed. These coefficients are generally pre-computed. The inverse, for example, depends on the register size used in the converter. For 16 bit registers the inverse is computed as 65536/m or $(1/m)(2^{16})$. The division is then accomplished by keeping only the most significant 15 bits of the 31 bit product of two 16 bit 2's compliment numbers. This is effectively a right shift of 16 bits or division by 65536. Note that $2^{-16}=1/65536$.

In the receiver the remainder circuits are restoring the original binary words with integer numbers of bits as they were received in register 12 at the transmitter. Thus, the multipliers $2^{-bi}$ and $2^{bi}$ in the receiver can be accomplished by shift operations.

Table II illustrates typical coefficients for 3200 bauds using 16 bit registers selected in accordance with the principles set forth above.

It should be understood that the apparatus is preferably implemented by using a microprocessor rather than using discrete components, for example by using the software program written in C and attached hereto. This software program illustrates one more application of the modulus convertor for data compression. Note that the number of input words is different than the number of output bauds. For data transmission this program will convert 3 input words at a 2400 Hz baud rate into 4 output bands at a 3200 Hz baud rate. This combination is useful because common multiplexer channel data rates are multiples of 2400 BPS.

Obviously numerous modifications can be made to the invention without departing from its scope as defined in the appended claims.

TABLE II

EXAMPLE OF PRE-COMPUTED COEFFICIENTS FOR ALL DATA RATES AT 3200 BAUD USING 16 BIT REGISTERS

| Data Rate | C | m | 1/m | $2^{b_3}$ | $2^{-b_3}$ | $2^{b_2}$ | $2^{-b_2}$ | $2^{b_1}$ | $2^{-b_1}$ | $2^{b_0}$ | $2^{-b_0}$ |
|---|---|---|---|---|---|---|---|---|---|---|---|
| 24000 | 15/2 | 182 | 360 | 256 | 256 | 128 | 512 | 256 | 256 | 128 | 512 |
| 21600 | 27/4 | 108 | 606 | 128 | 512 | 128 | 512 | 128 | 512 | 64 | 1024 |
| 19200 | 6 | 64 | 1024 | 64 | 1024 | 64 | 1024 | 64 | 1024 | 64 | 1024 |
| 16800 | 21/4 | 39 | 1680 | 64 | 1024 | 32 | 2048 | 32 | 2048 | 32 | 2048 |
| 14400 | 9/2 | 23 | 2849 | 32 | 2048 | 16 | 4096 | 32 | 2048 | 16 | 4096 |
| 12000 | 15/4 | 14 | 4681 | 16 | 4096 | 16 | 4096 | 16 | 4096 | 8 | 8192 |
| 9600 | 3 | 8 | 8192 | 8 | 8192 | 8 | 8192 | 8 | 8192 | 8 | 8192 |
| 7200 | 9/4 | 5 | 13107 | 8 | 8192 | 4 | 16384 | 4 | 16384 | 4 | 16384 | m = smallest integer $\geq 2^c$
1/m = $2^{16}/m$

We claim:

1. A modulus converter for converting binary data at a preselected bit rate to words at a preselected baud rate wherein the ratio of the bit-to-baud rates is not an integer, said ratio being defined by a fraction having a numerator and a divisor, said converter comprising:
   a. partitioning means for partitioning the incoming data into frames of bits equal to said numerator, each frame being further partitioned into words of unequal bits the number of words per frame being equal to said divisor;
   b. a plurality of transmit remainder calculating means for generating transmit remainders corresponding to said words based on a preselected modulus m; and
   c. encoding means for encoding said transmit remainders into bauds for transmission on a data channel.

2. The system of claim 1 wherein said encoding means includes a multiplexer switch means.

3. The system of claim 1 wherein said fraction is c and said modulus is approximately equal to $2^c$.

4. A method of converting data at a fractional rate comprising the steps of:
   a. partitioning incoming data into sequential frames, each frame consisting of a preset number of bits;
   b. partitioning each frame into words, at least two words within each frame having an unequal number of bits;
   c. dividing each word in sequence by a modulus to generate remainders; and
   d. encoding said remainders into bauds.

5. The method of claim 4 wherein said remainders are encoded by multi-plexing the remainders in sequence.

6. The method of claim 5 wherein incoming data has a bit rate which is converted at a preselected baud rate, the ratio of said bit rate to baud rate defining a fraction, and wherein the number of bits per frame equals the numerator of said fraction and the number of words per frame equals the divisor of said fraction.

* * * * *